(12) United States Patent
Luk et al.

(10) Patent No.: US 11,799,434 B2
(45) Date of Patent: Oct. 24, 2023

(54) RECEIVER AUTOMATIC GAIN CONTROL SYSTEMS AND METHODS

(71) Applicant: Ciena Corporation, Hanover, MD (US)

(72) Inventors: Tom Luk, Ottawa (CA); Ron Hartman, Fitzroy Harbour (CA)

(73) Assignee: Ciena Corporation, Hanover, MD (US)

( * ) Notice: Subject to any disclaimer, the term of this patent is extended or adjusted under 35 U.S.C. 154(b) by 70 days.

(21) Appl. No.: 17/601,314

(22) PCT Filed: Mar. 4, 2020

(86) PCT No.: PCT/US2020/020854
§ 371 (c)(1),
(2) Date: Oct. 4, 2021

(87) PCT Pub. No.: WO2020/180905
PCT Pub. Date: Sep. 10, 2020

(65) Prior Publication Data
US 2022/0399866 A1      Dec. 15, 2022

Related U.S. Application Data

(63) Continuation of application No. 16/291,036, filed on Mar. 4, 2019, now Pat. No. 10,594,281.

(51) Int. Cl.
*H03G 3/30* (2006.01)
*H03F 3/45* (2006.01)
*H04B 1/16* (2006.01)

(52) U.S. Cl.
CPC ....... *H03G 3/3036* (2013.01); *H03F 3/45475* (2013.01); *H03G 3/3089* (2013.01);
(Continued)

(58) Field of Classification Search
CPC .. H03G 3/3036; H03G 3/3084; H03G 3/3052; H03G 3/3089; H03G 2201/307;
(Continued)

(56) References Cited

U.S. PATENT DOCUMENTS 5,936,754 A  *  8/1999  Ariyavisitakul ........................... H04B 10/25758
398/103
6,009,317 A     12/1999  Wynn
(Continued)

FOREIGN PATENT DOCUMENTS

EP      3 110 019 A1    12/2016

OTHER PUBLICATIONS

Jun. 22, 2020 International Search Report and Written Opinion for International Application No. PCT/US2020/020854.

*Primary Examiner* — Sophia Vlahos
(74) *Attorney, Agent, or Firm* — Baratta Law PLLC; Lawrence A. Baratta, Jr.

(57) ABSTRACT

An automatic gain control system for a receiver, including: an automatic gain control loop (40) adapted to be coupled to both a first transimpedance amplifier (12) coupled to a first analog-to-digital converter (14) forming a first tributary and a second transimpedance amplifier (12) coupled to a second analog-to-digital converter (14) forming a second tributary; and an offset gain control voltage to gain balance a transimpedance amplifier gain of the first tributary and a transimpedance amplifier gain of the second tributary. The automatic gain control loop can be analog. Also, the automatic gain control loop can be implemented in hardware or firmware.

19 Claims, 13 Drawing Sheets

(52) U.S. Cl.
CPC ......... *H04B 1/16* (2013.01); *H03F 2200/129* (2013.01); *H03F 2200/331* (2013.01); *H03F 2200/336* (2013.01); *H03F 2200/451* (2013.01); *H03F 2203/45116* (2013.01); *H03G 2201/307* (2013.01)

(58) Field of Classification Search
CPC ........ H03G 3/3068; H03G 3/001; H03G 3/20; H04B 1/12; H04B 1/0007; H04B 1/16; H04B 10/61; H03F 3/45475; H03F 2200/129; H03F 2200/336; H03F 2200/331; H03F 2200/451; H03F 2203/45116; H04L 27/3809
See application file for complete search history.

(56) References Cited

U.S. PATENT DOCUMENTS

| | | | |
|---|---|---|---|
| 6,188,737 B1 | 2/2001 | Bruce et al. | |
| 6,317,589 B1 | 11/2001 | Nash | |
| 6,785,308 B2 | 8/2004 | Dyer et al. | |
| 6,871,304 B2 | 3/2005 | Hadjihassan et al. | |
| 6,963,733 B2 | 11/2005 | Eriksson et al. | |
| 6,980,140 B1 | 12/2005 | Rowland et al. | |
| 7,936,999 B1* | 5/2011 | Hawryluck | H04L 7/0075 398/208 |
| 7,940,822 B1 | 5/2011 | Cao et al. | |
| 8,301,039 B2* | 10/2012 | Nishihara | H04B 10/61 398/208 |
| 10,209,127 B2 | 2/2019 | Luk et al. | |
| 2001/0022821 A1 | 9/2001 | Ichihara | |
| 2003/0007210 A1* | 1/2003 | Kenny | H04J 14/0252 348/E7.07 |
| 2005/0058228 A1 | 3/2005 | Birkett | |
| 2006/0285854 A1* | 12/2006 | Sun | H03L 7/085 398/155 |
| 2007/0248197 A1* | 10/2007 | Lee | H03G 3/3089 375/345 |
| 2008/0123785 A1 | 5/2008 | Lebron et al. | |
| 2013/0127529 A1* | 5/2013 | Morita | H03G 3/20 330/124 R |
| 2013/0142293 A1* | 6/2013 | Yoshida | H03G 3/3078 375/345 |
| 2013/0236172 A1* | 9/2013 | Suzuki | H04J 14/02 398/43 |
| 2013/0343751 A1* | 12/2013 | Mamyshev | H04B 10/615 398/202 |
| 2017/0075081 A1 | 3/2017 | Uk et al. | |
| 2017/0104507 A1* | 4/2017 | Fernando | H04B 1/16 |
| 2017/0126352 A1* | 5/2017 | Chen | H04B 10/516 |
| 2018/0152242 A1* | 5/2018 | Kurisu | H04B 10/0795 |

* cited by examiner

RECEIVER AUTOMATIC GAIN CONTROL SYSTEMS AND METHODS

TECHNICAL FIELD

The present disclosure relates generally to the optical networking field. More specifically, the present disclosure relates to receiver automatic gain control (AGC) systems and methods such as for asymmetrical or unbalanced constellations.

BACKGROUND ART

By way of receiver gain control background, each of the receiver tributaries (XI:XQ:YI:YQ) typically has its own independent AGC loop to control its gain to maintain a constant radio frequency (RF) power ($P_{ADC}$) at the high speed analog-to-digital converter (ADC) input. An independent AGC loop per receiver tributary works fine for symmetrical constellations, where the power on the I-axis and the power on the Q-axis are always the same regardless of rotation, e.g., for a quadrature phase shift keying (QPSK) signal of equal power for all four constellations.

As illustrated in FIG. 1, because the distance from the origin to each constellation is the same, the power on each axis is the same.

$$P_{Axis,I} = P_{Axis,Q} = (A\cos\theta)^2 + (A\sin\theta)^2 = A^2 \quad (1)$$

Thus, the powers on the I and Q axes are constant independent of θ. This is true for all symmetrical constellations.

As illustrated in FIG. 2, all commercially available dual (illustrated) and quad transimpedance amplifiers (TIAs) for coherent receivers utilize such independent AGC loops. Here, for the coherent receiver 10, the TIAs 12 are each coupled to their own ADC 14 and utilize their own AGC loop 16. For each channel, DET 18 is the power detector of the TIA RF output, VDET 20 is the detector output voltage, VREF 22 is the reference voltage of the AGC loop 16, 24 is the voltage summing (error=VREF−V DET), the loop filter 26 is the integrator loop (VGC=$K_{LF}$∫error dt), and $P_{ADC,ch}$ 28 is the RF power at the ADC input. Again, the gain of each channel is controlled by its own AGC loop 16, and the AGC loop 16 of each channel locks the RF power to the ADC 14 to a constant value.

For constellations that are single-axis, e.g., binary phase shift keying (BPSK), quaternary amplitude shift keying (4ASK), and constellations that are otherwise engineered to be asymmetrical, an independent AGC loop per tributary is not desirable. Such constellations are constantly rotating. The angular speed of rotation depends on the intermodulation frequency (IF) between the transmitter (Tx) and the receiver (Rx). When the IF falls within the tracking bandwidth of the AGC loop, the two or four independent AGCs will act to re-normalize the I and Q power imbalance and the received symbols at the corresponding ADC will appear to have symmetrical projections to the downstream digital signal processor (DSP). This re-normalization destroys the integrity of BPSK and 4ASK. It also removes the benefits of the engineered asymmetrical constellation.

The objective is to maintain the signature of the I and Q power imbalance or ratio at the ADC. Instead of locking the RF power at the I-axis ADC and the Q-axis ADC individually with two AGC loops, one AGC loop will be used to lock the SUM of the RF power at the I-axis and Q-axis ADCs.

As illustrated in FIG. 3, the distance from the origin to each pair of constellations is different. Therefore, the power on the I-axis and the Q-axis is different.

$$P_{Axis,I} = (A\cos\theta)^2(B\sin\theta)^2; P_{Axis,Q} = (A\sin\theta)^2 + (B\cos\theta)^2 \quad (2)$$

However, adding the power of the I-axis and the Q-axis together, the total power constant is independent of θ.

$$P_{Axis,I} + P_{Axis,Q} = (A\cos\theta)^2 + (B\sin\theta)^2 + (A\sin\theta)^2 + (B\cos\theta)^2 \quad (3)$$

$$P_{Axis,I} + P_{Axis,Q} = A^2 + B^2 \quad (4)$$

Thus, again, all commercially available TIAs are designed with dedicated AGC loops per tributary. Many TIAs do not have integrated AGC loops, but utilize external AGC loops to set their gain. Typically, these external AGC loops are digital.

Commercially available TIAs having dedicated AGC loops per tributary typically have bandwidths from tens of KHz to MHz. Therefore, when an asymmetrical modulated signal is applied, the AGC loop can track the IF and re-normalize the associated constellation. Particularly if end-to-end laser frequency control is active, there is a high probability that IF≈0. Alternatively, one can set the AGC bandwidth to a very, very low bandwidth, e.g., BWAGC<1 Hz, so that the AGC loops do not track low-frequency IF. However, this limits the capability of the AGC loops to track optical power transients.

Current TIAs with external AGC circuits often have a digital AGC loop integrated in a field-programmable gate array (FPGA), for example. These digital AGC loops may have the functionality to control the I and Q gains from two independent AGC loops or from one common AGC loop. These current digital AGC solutions are, however, not suitable for use in high-integration pluggable coherent modems. There are many interconnects between the DSP-to-TIA chips and many external components that limit integration and introduce noise. Furthermore, the digital AGC loop drives complexity to the DSP chip. An integrated analog AGC loop in the TIA is thus a more suitable solution for pluggable coherent modems.

A conventional external digital AGC circuit 30 is illustrated in FIG. 4. With the AGC loop implemented in the TIA 12 instead, this enables greater integration (area, power, etc.) and more flexible hardware/technology migration (DSP evolution, commercial DSP usage, etc.) without re-designing and re-verifying existing AGC loops in the FPGA or application-specific integrated circuit (ASIC).

SUMMARY

Thus, in accordance with the present disclosure, instead of having a dedicated AGC loop per tributary, the I and Q tributaries share a common AGC loop, i.e., XI:XQ share a common AGC loop and YI:YQ share a common AGC loop. This allows the receiver to set and control a constant total I and Q power to the ADC. The common AGC bandwidth can be the same as the dedicated AGC bandwidth. Therefore, the common AGC can retain the capability to track fast optical power transients. Besides having a common AGC loop for I and Q tributaries, an IQ Gain Balancing function is added to set both I and Q tributaries to have the same gain with one AGC output control signal.

In one exemplary embodiment, the present disclosure provides an automatic gain control system for a receiver for an asymmetrical and/or unbalanced constellation, the system including: an automatic gain control loop adapted to be coupled to both a first transimpedance amplifier coupled to a first analog-to-digital converter forming a first tributary and a second transimpedance amplifier coupled to a second analog-to-digital converter forming a second tributary; wherein the automatic gain control loop is operable for providing an offset gain control voltage to gain balance a transimpedance amplifier voltage and a power associated with the first tributary and a transimpedance amplifier voltage and a power associated with the second tributary. The automatic gain control loop includes an analog automatic gain control loop. The automatic gain control loop is implemented in hardware or firmware and generally includes a first detector operable for measuring a first detected voltage associated with the first tributary and a second detected voltage associated with the second tributary, logic operable for comparing the first detected voltage and the second detected voltage and a reference voltage, and a loop filter operable for integrating a voltage difference to provide the offset gain control voltage. Optionally, the automatic gain control loop includes a first digital power detector coupled to the first analog-to-digital converter and operable for measuring a detected power of the first tributary and a second digital power detector coupled to the second analog-to-digital converter and operable for measuring a detected power of the second tributary. The automatic gain control loop is configured to be selectively operated in a common mode in which the transimpedance amplifier voltage and the power associated with the first tributary and the transimpedance amplifier voltage and the power associated with the second tributary are gain balanced and a normal mode in which the transimpedance amplifier voltage and the power associated with the first tributary and the transimpedance amplifier voltage and the power associated with the second tributary are not gain balanced.

In another exemplary embodiment, the present disclosure provides a receiver for an asymmetrical and/or unbalanced constellation, the receiver including: a first transimpedance amplifier coupled to a first analog-to-digital converter forming a first tributary; a second transimpedance amplifier coupled to a second analog-to-digital converter forming a second tributary; and an automatic gain control loop coupled to both the first transimpedance amplifier and the second transimpedance amplifier, wherein the automatic gain control loop is operable for providing an offset gain control voltage to gain balance a transimpedance amplifier voltage and a power associated with the first tributary and a transimpedance amplifier voltage and a power associated with the second tributary. The automatic gain control loop includes an analog automatic gain control loop. The automatic gain control loop is implemented in hardware or firmware and generally includes a first detector operable for measuring a first detected voltage associated with the first tributary and a second detected voltage associated with the second tributary, logic operable for comparing the first detected voltage and the second detected voltage and a reference voltage, and a loop filter operable for integrating a voltage difference to provide the offset gain control voltage. Optionally, the automatic gain control loop includes a first digital power detector coupled to the first analog-to-digital converter and operable for measuring a detected power of the first tributary and a second digital power detector coupled to the second analog-to-digital converter and operable for measuring a detected power of the second tributary. The automatic gain control loop is configured to be selectively operated in a common mode in which the transimpedance amplifier voltage and the power associated with the first tributary and the transimpedance amplifier voltage and the power associated with the second tributary are gain balanced and a normal mode in which the transimpedance amplifier voltage and the power associated with the first tributary and the transimpedance amplifier voltage and the power associated with the second tributary are not gain balanced.

In a further exemplary embodiment, the present disclosure provides an automatic gain control method for a receiver for an asymmetrical and/or unbalanced constellation, the method including: providing an automatic gain control loop adapted to be coupled to both a first transimpedance amplifier coupled to a first analog-to-digital converter forming a first tributary and a second transimpedance amplifier coupled to a second analog-to-digital converter forming a second tributary; and, using the automatic gain control loop, providing an offset gain control voltage to gain balance a transimpedance amplifier voltage and a power associated with the first tributary and a transimpedance amplifier voltage and a power associated with the second tributary. The automatic gain control loop includes an analog automatic gain control loop. The automatic gain control loop is implemented in hardware or firmware and generally includes a first detector operable for measuring a first detected voltage associated with the first tributary and a second detected voltage associated with the second tributary, logic operable for comparing the first detected voltage and the second detected voltage and a reference voltage, and a loop filter operable for integrating a voltage difference to provide the offset gain control voltage. Optionally, the automatic gain control loop includes a first digital power detector coupled to the first analog-to-digital converter and operable for measuring a detected power of the first tributary and a second digital power detector coupled to the second analog-to-digital converter and operable for measuring a detected power of the second tributary. The automatic gain control loop is configured to be selectively operated in a common mode in which the transimpedance amplifier voltage and the power associated with the first tributary and the transimpedance amplifier voltage and the power associated with the second tributary are gain balanced and a normal mode in which the transimpedance amplifier voltage and the power associated with the first tributary and the transimpedance amplifier voltage and the power associated with the second tributary are not gain balanced.

BRIEF DESCRIPTION OF THE DRAWINGS

The present disclosure is illustrated and described herein with reference to the various drawings, in which like reference numbers are used to denote like system components/method steps, as appropriate, and in which.

DESCRIPTION OF EMBODIMENTS

Figure 1:
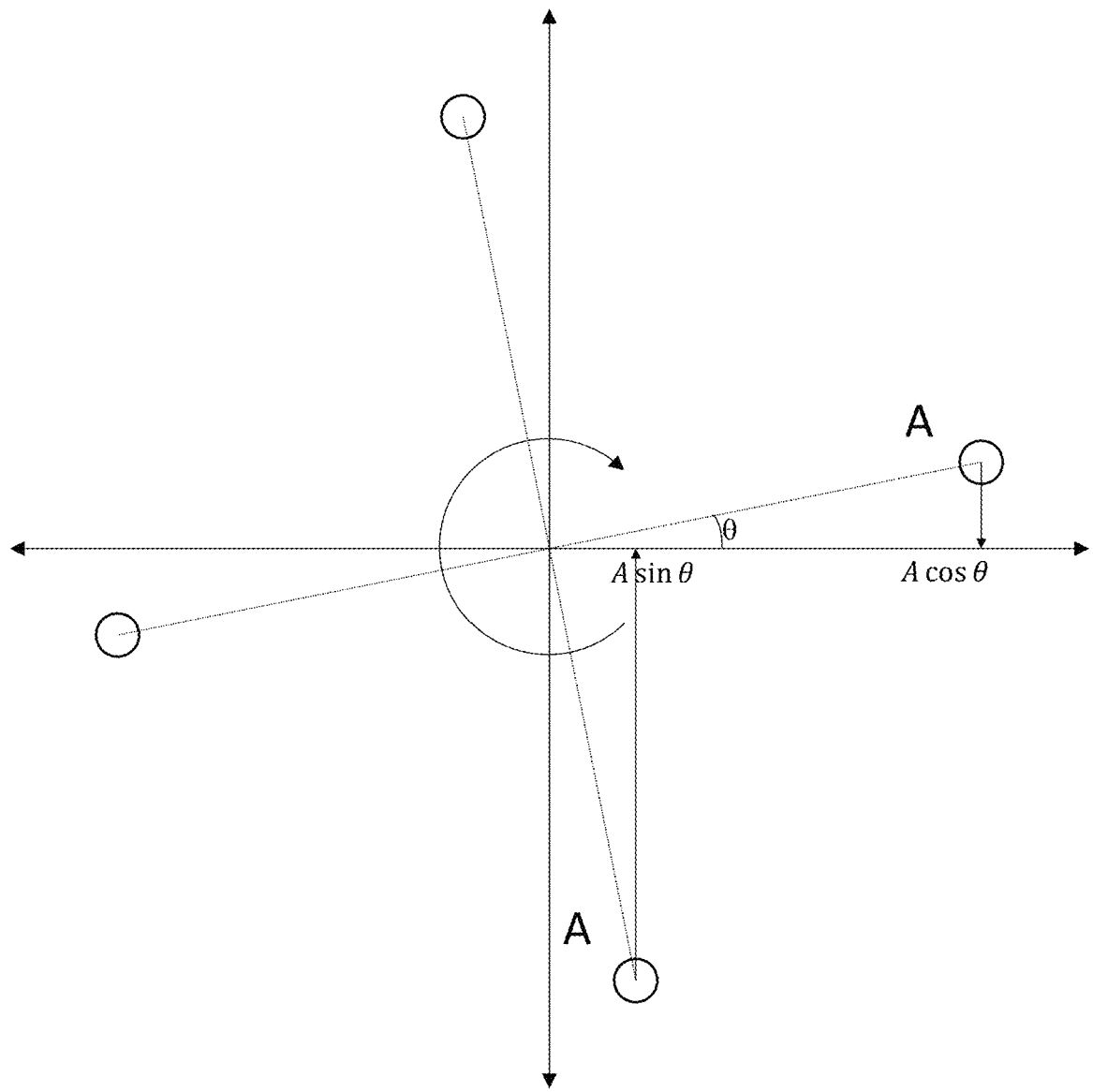
FIG. 1 is a plot illustrating that the powers on the I and Q axes are constant independent of θ for symmetrical constellations.
Figure 2:
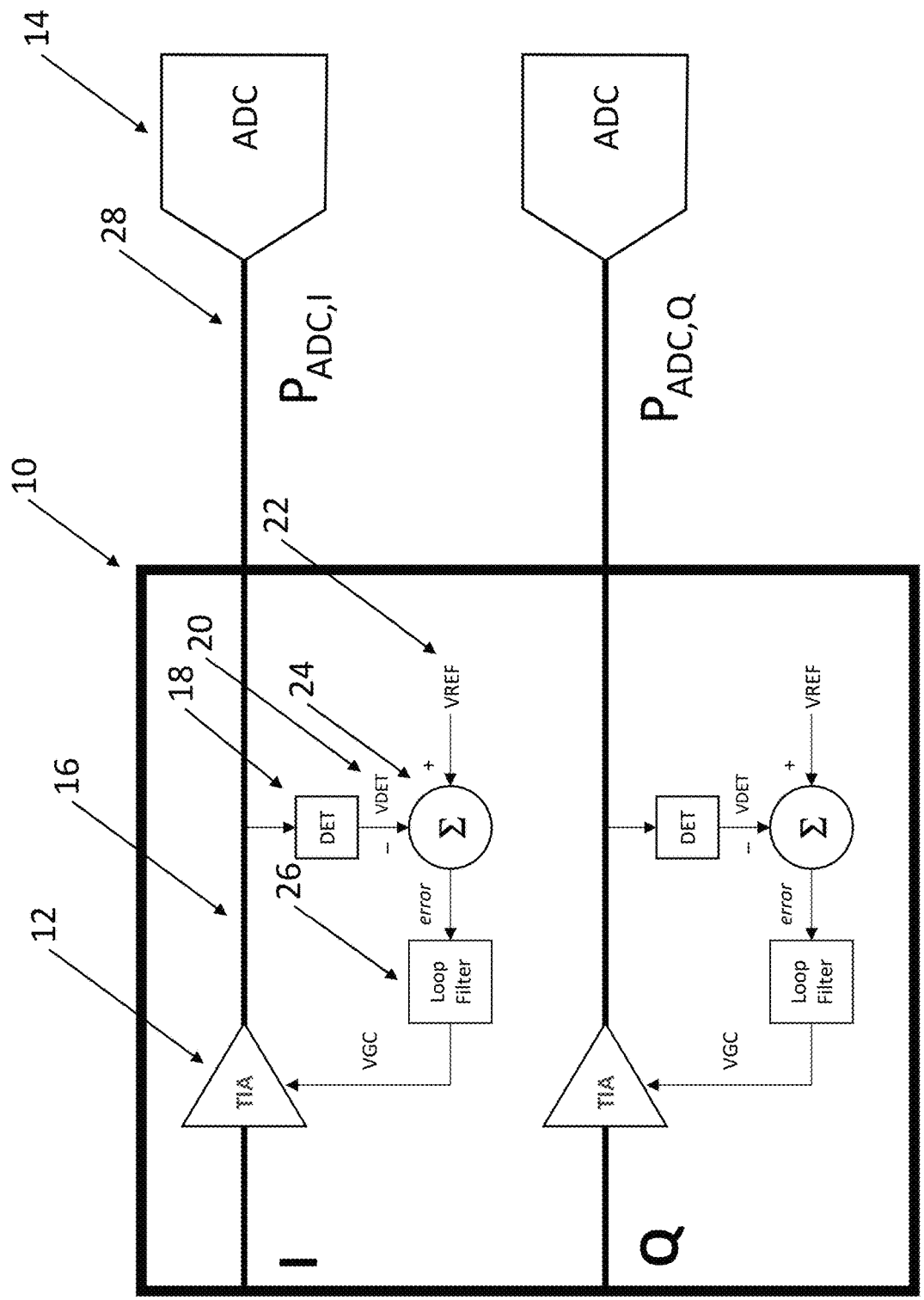
FIG. 2 is a schematic diagram illustrating a conventional per channel AGC loop configuration, with a dedicated AGC loop for each TIA and ADC.
Figure 3:
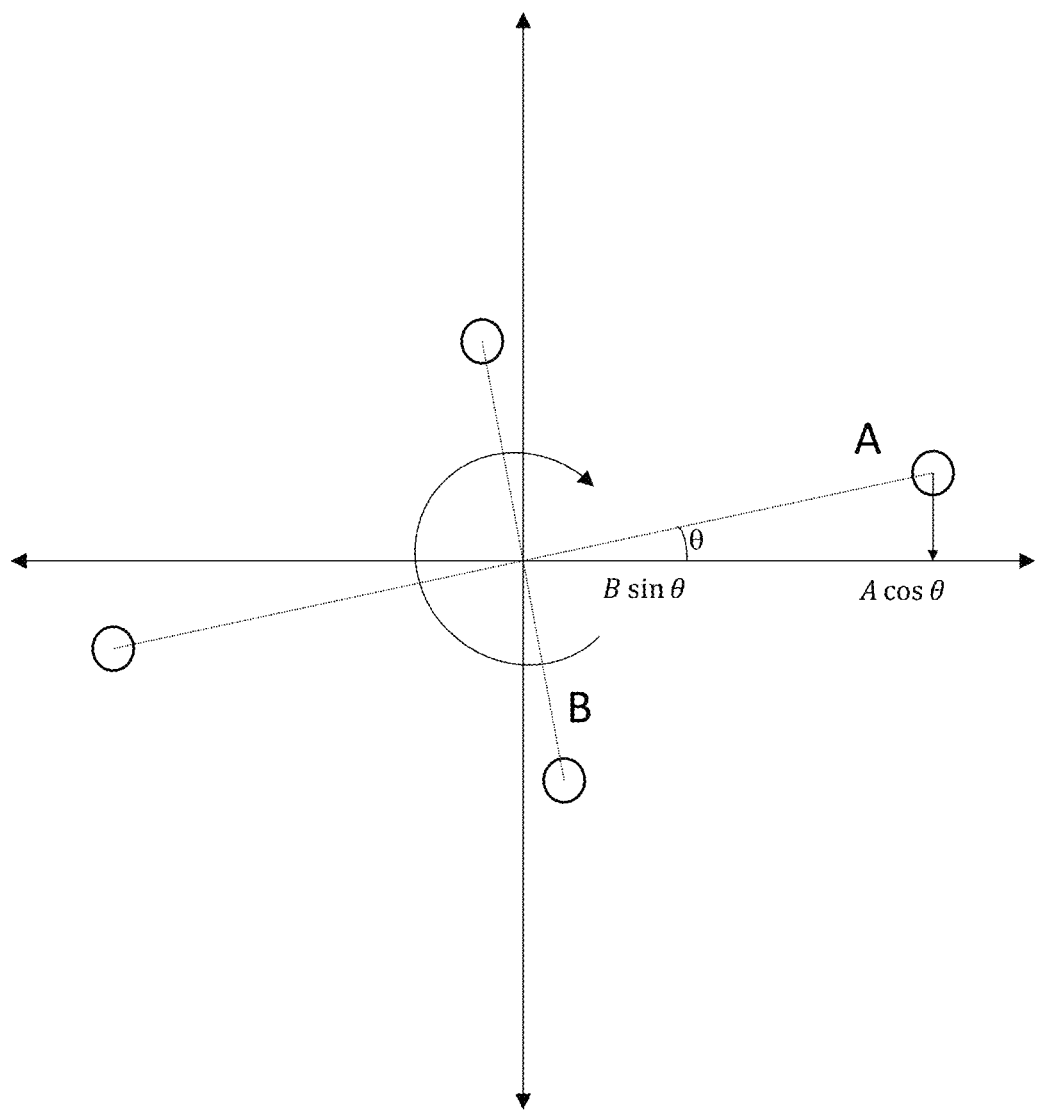
FIG. 3 is a plot illustrating that the powers on the I and Q axes are not constant independent of θ for asymmetrical constellations.
Figure 4:
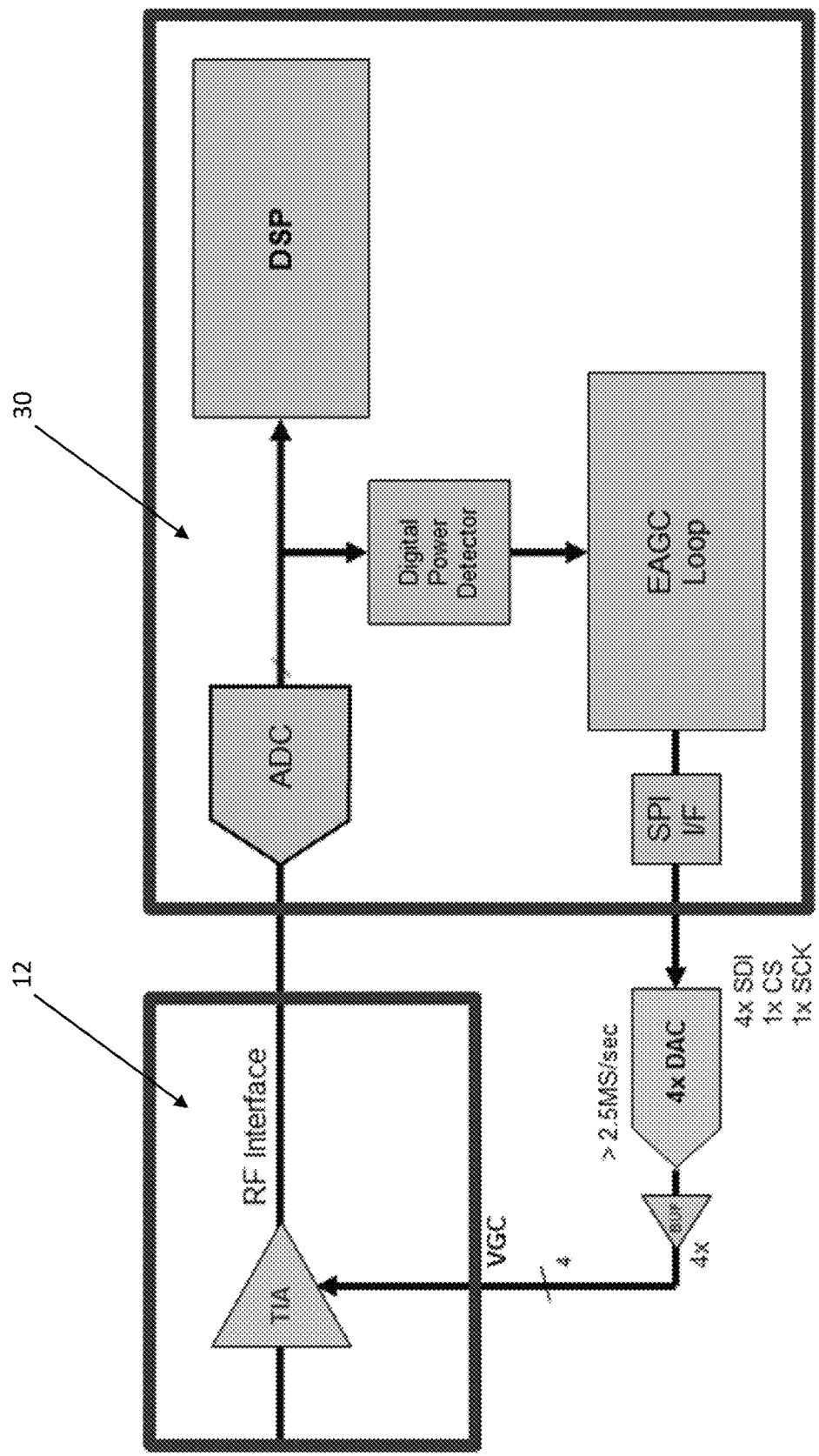
FIG. 4 is a schematic diagram illustrating a conventional digital per channel or common AGC loop configuration, with a dedicated or common AGC loop for each or all TIA(s) and ADC(s)
Figure 5:
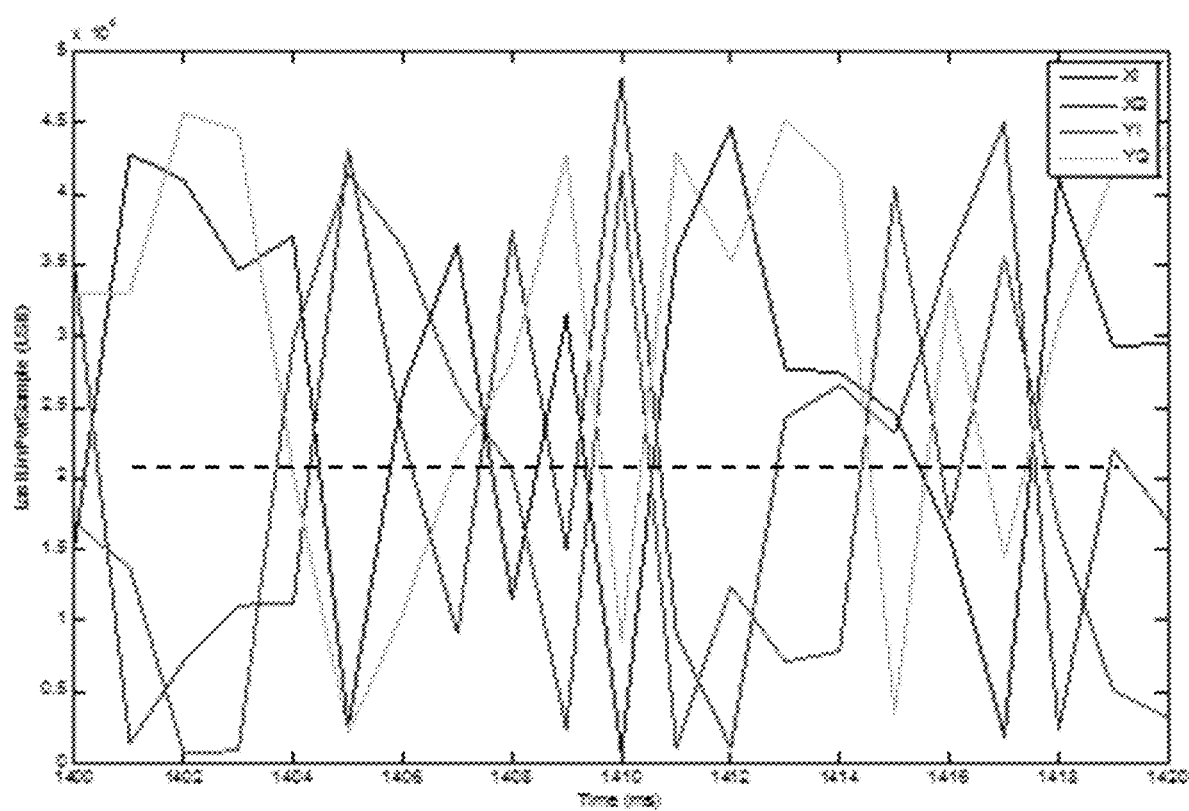
FIG. 5 is a plot illustrating that the XI↔XQ and YI↔YQ powers fluctuate in complement to each other as the IF between a Tx and a Rx changes, thus the powers XI+XQ and YI+YQ are ~constant accordingly.

As illustrated in FIG. 5, the XI↔XQ and YI↔YQ powers fluctuate in complement to each other as the IF between the Tx and the Rx changes. The powers XI+XQ and YI+YQ are constant accordingly, as indicated by the dashed line.

Figure 6:
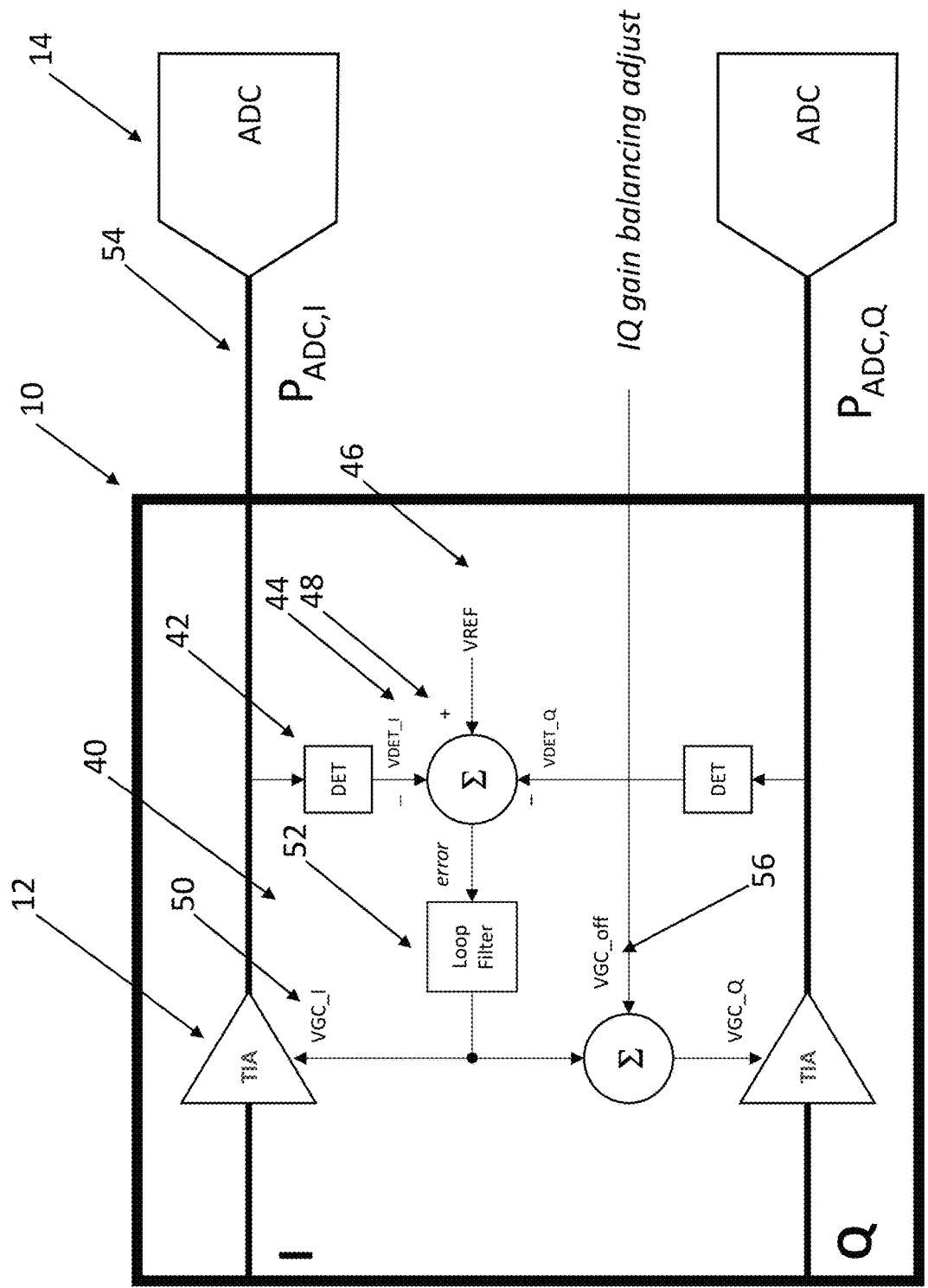
FIG. 6 is a schematic diagram illustrating one exemplary embodiment of the analog AGC loop implementation of the present disclosure, incorporating an IQ gain balancing adjustment.

Referring now specifically to FIG. 6, in one exemplary embodiment, the receiver 10 includes a pair of TIAs 12 that utilize a common analog AGC loop 40 to control the gain of the I and Q channels that locks the sum of the I and Q RF powers to the AGC loop 40 to a constant value; that is:

$$\text{error}=VREF-VDET\_I-VDET\_Q \to 0 \quad (5)$$

DET 42 is the power detector of the TIA RF output, VDET_ch 44 is the detector output voltage, VREF 46 is the reference voltage of the AGC loop 40, 48 is the voltage summing (error=VREF−VDET_I−VDET_Q), VGC_ch 50 is the TIA gain control voltage, the loop filter 52 is the integrator loop (VGC_I=$K_{LF}\int$error dt, VGC_Q=VGC_I+VGC_off), and $P_{ADC,ch}$ 54 is the RF power at the ADC input.

The error voltage is integrated by the loop filter 52; its output controls the TIA gain of both the I-axis and the Q-axis. Since the receiver (TZ) gain as a function of VGC is not the same from one TIA 12 to another, a DC offset (VGC_off) 56 is added to one of the two channels for IQ gain balancing. The method to determine and set VGC_off 56 to balance the receiver gain between the I and Q-axis per polarization is described herein below.

Figure 7:
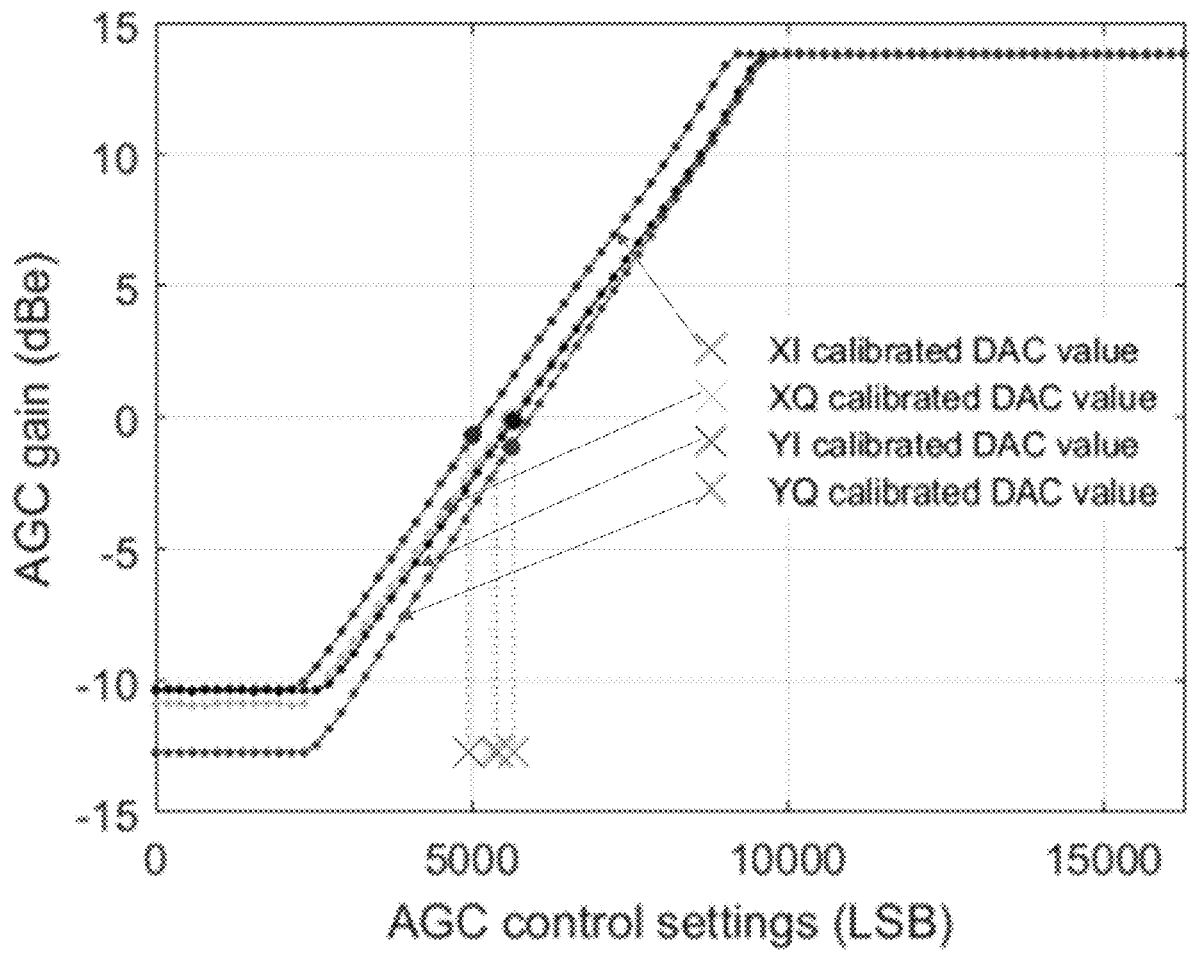
FIG. 7 is a plot illustrating why IQ gain balancing is required.

FIG. 7 illustrates a sample receiver optical-electrical conversion gain (OE-CG) per tributary. For a single gain setting for XI:XQ or YI:YQ, each tributary would have a different OE-CG. In order to preserve the power distinction of BPSK/4ASK signals and the power ratio of asymmetrical modulated signals, the OE-CG of each IQ pair should be the same, to the extent possible.

Figure 8:
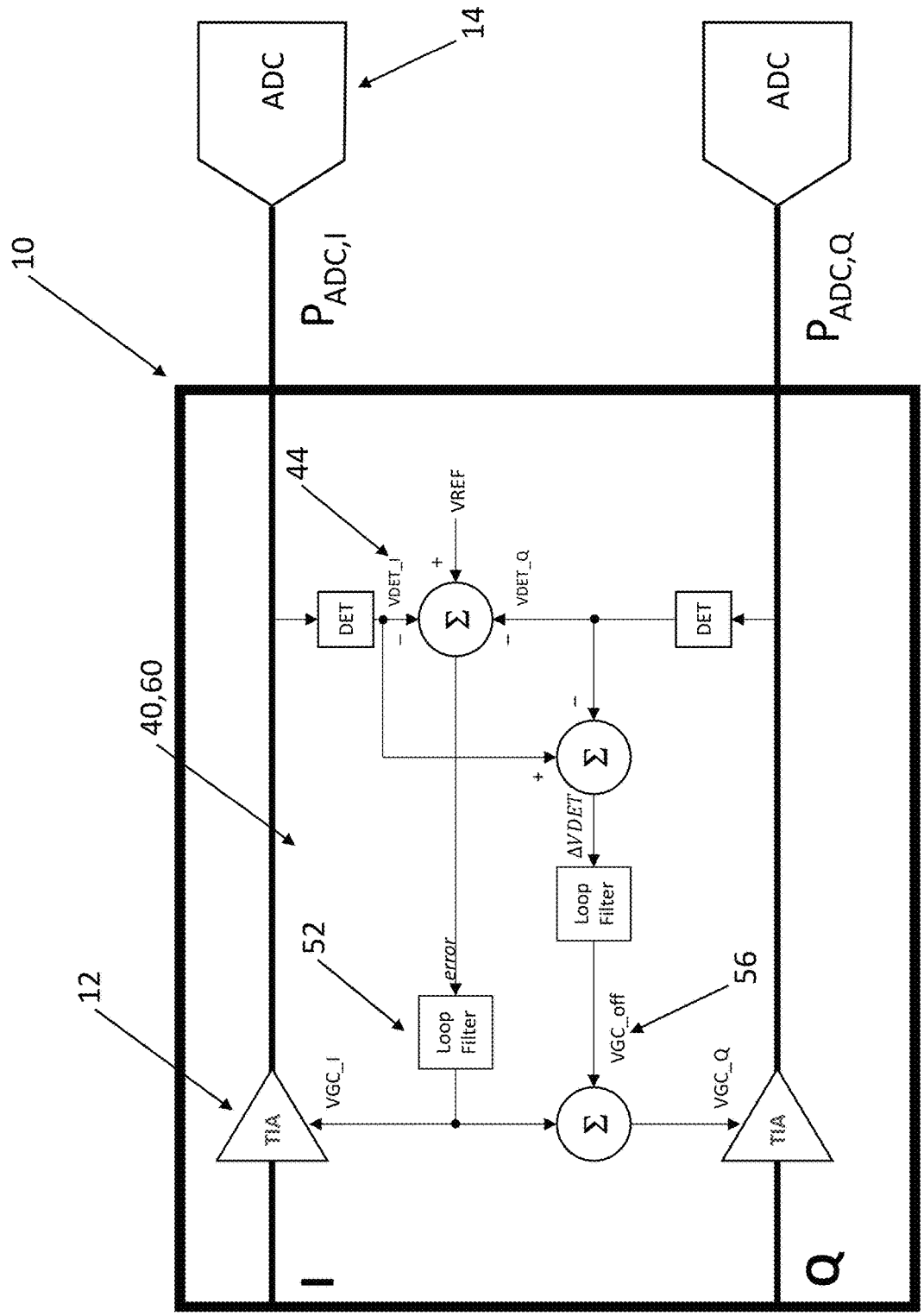
FIG. 8 is a schematic diagram illustrating another exemplary embodiment of the analog AGC loop implementation of the present disclosure, incorporating a common AGC loop and a hardware-based IQ gain balancing loop.

Referring now specifically to FIG. 8, in another exemplary embodiment, a TIA implementation is illustrated with a common AGC loop 40 and a hardware-based IQ gain balancing loop 60. The gain balancing of the I-axis and the Q-axis is performed by a slow loop. Its function is:

$$VGC\_off(t)=K_{GB}\int \Delta VDET dt, \text{ where } K_{GB}=\text{gain balancing loop filter gain} \quad (6)$$

$$\Delta VDET=VDET\_I-VDET\_Q \quad (7)$$

The IQ gain balancing loop 60 forces $\Delta VDET \to 0$. Because the TIA 12 must operate when IF 0, the time constant of the IQ gain balancing loop filter 52 has to be slow to generate a stable VGC_off 56 when VDET_I 44 and VDET_Q 44 are fluctuating at a slow rate. The selected value for the gain balancing loop for is 40 sec, for example.

Figure 9:
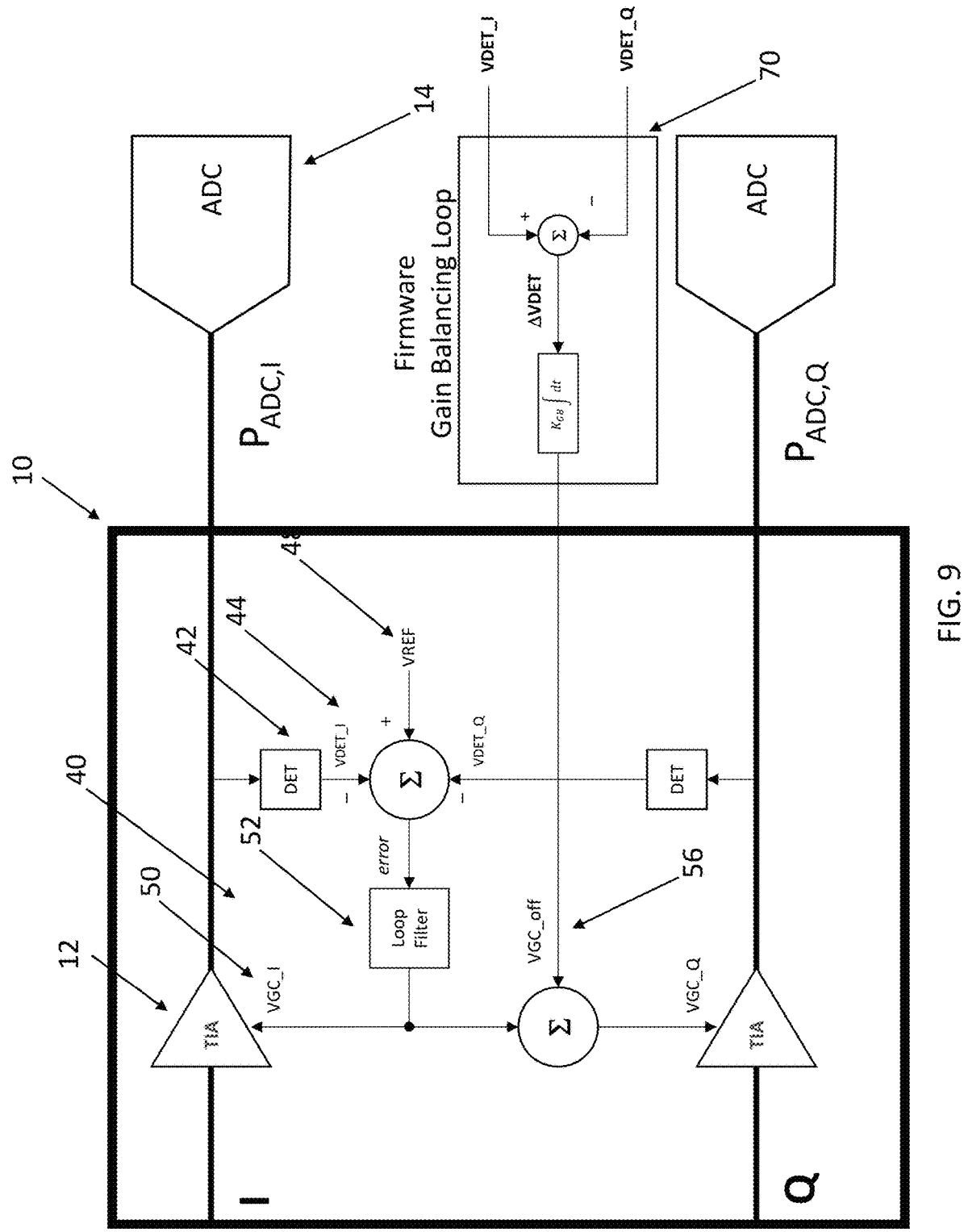
FIG. 9 is a schematic diagram illustrating a further exemplary embodiment of the analog AGC loop implementation of the present disclosure, incorporating a common AGC loop and a firmware-based IQ gain balancing loop.

Referring now specifically to FIG. 9, in a further exemplary embodiment, a TIA implementation is illustrated with a common AGC loop 40 and a firmware-based IQ gain balancing loop 70 to balance the TIA gain of the I-axis and the Q-axis. Firmware reads VDET_I 44 and VDET_Q 44 via the TIA's ADC-SPI interface (not illustrated), subtracts for the difference "ΔVDET" and integrates ΔVDET. The output of the integrated value drives an offset gain control voltage of the Q-axis via the TIA's SPI-DAC interface (not illustrated). Again, DET 42 is the power detector of the TIA RF output, VDET_ch 44 is the detector output voltage, VREF 46 is the reference voltage of the AGC loop 40, 48 is the voltage summing (error=VREF−VDET_I−VDET_Q), VGC_ch 50 is the TIA gain control voltage, the loop filter 52 is the integrator loop (VGC_I=$K_{LF}\int$error dt, VGC_Q=VGC_I+VGC_off, $K_{LF}$=loop filter gain constant), and $P_{ADC,ch}$ 54 is the RF power at the ADC input.

Figure 10:
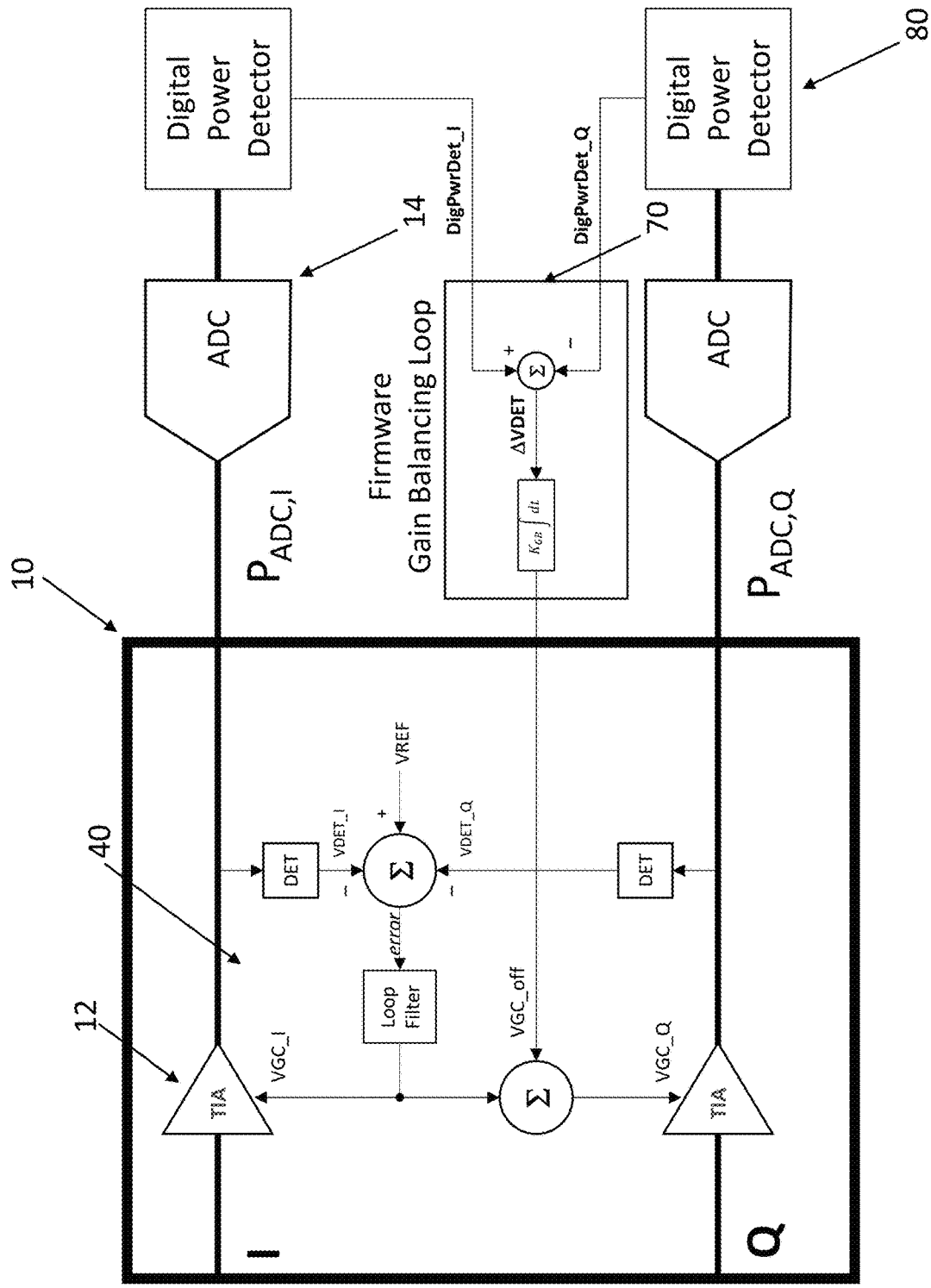
FIG. 10 is a schematic diagram illustrating a still further exemplary embodiment of the analog AGC loop implementation of the present disclosure, incorporating a common AGC loop and a firmware-based IQ gain balancing loop incorporating a post-ADC digital power detector instead of the analog power detector of the TIA.

Referring now specifically to FIG. 10, in a still further exemplary embodiment, a TIA implementation is illustrated with a common AGC loop 40 and an alternative firmware-based IQ gain balancing loop 70 to balance the TIA gain of the I-axis and the Q-axis. Here, the IQ gain balancing loop 70 makes use of a more accurate post-ADC digital power detector 80 instead of the analog power detector of the TIA 12.

Figure 11:
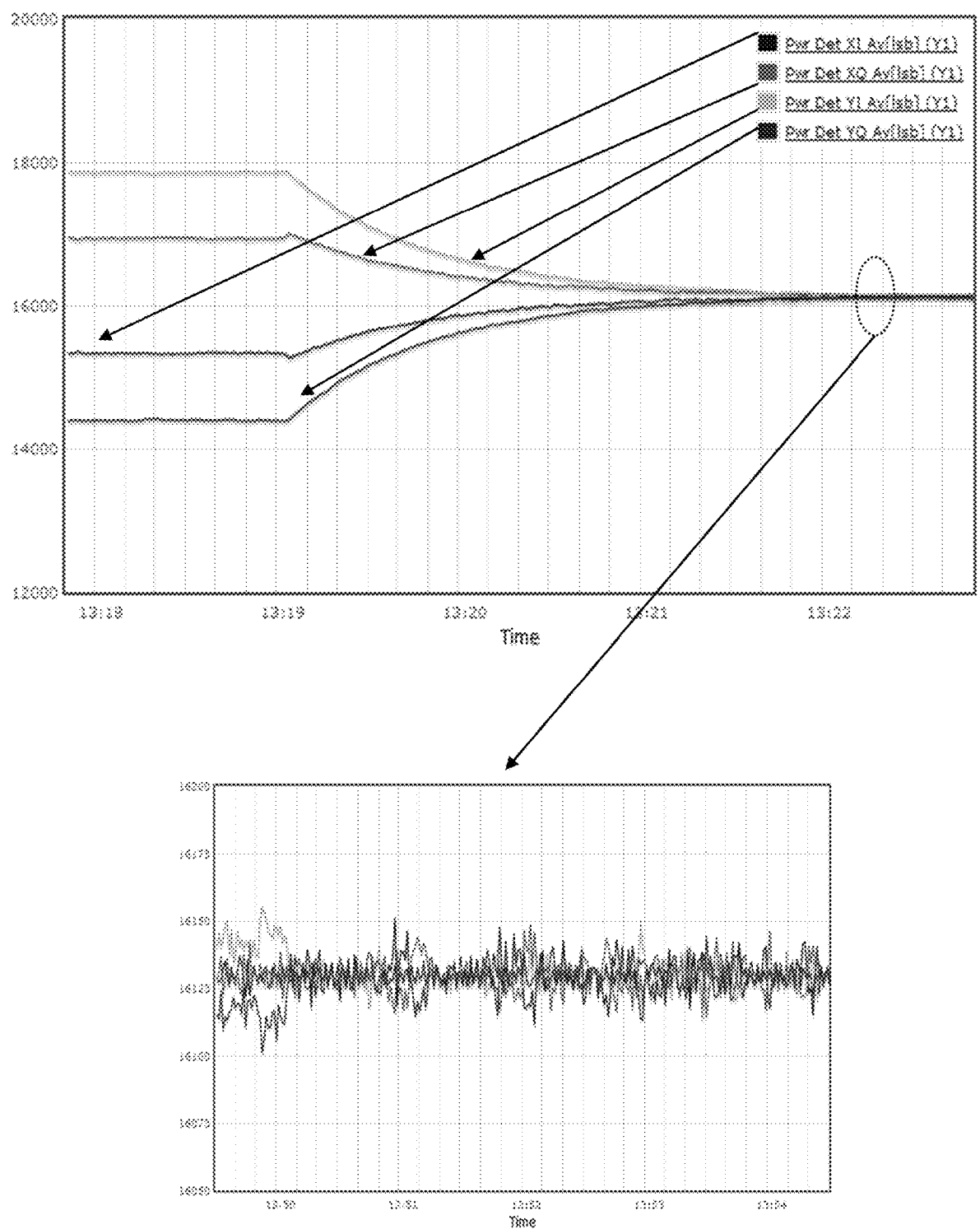
FIG. 11 is a plot illustrating that before the IQ gain balancing loop is initiated, the power of XI, XQ, YI, and YQ are all different, even though PXI+PXQ=target and PYI+PYQ=target, and, with the IQ gain balancing loop running, the power of all channels converge to a target.

FIG. 11 illustrates that before the IQ gain balancing loop is initiated at 13 hr:19 min, the power of XI, XQ, YI, and YQ are all different, even though PXI+PXQ=target and PYI+PYQ=target. With the IQ gain balancing loop running, the power of all channels converge to the target ~16130. It is a slow loop and takes ~90 sec for 90% convergence, for example.

Figure 12:
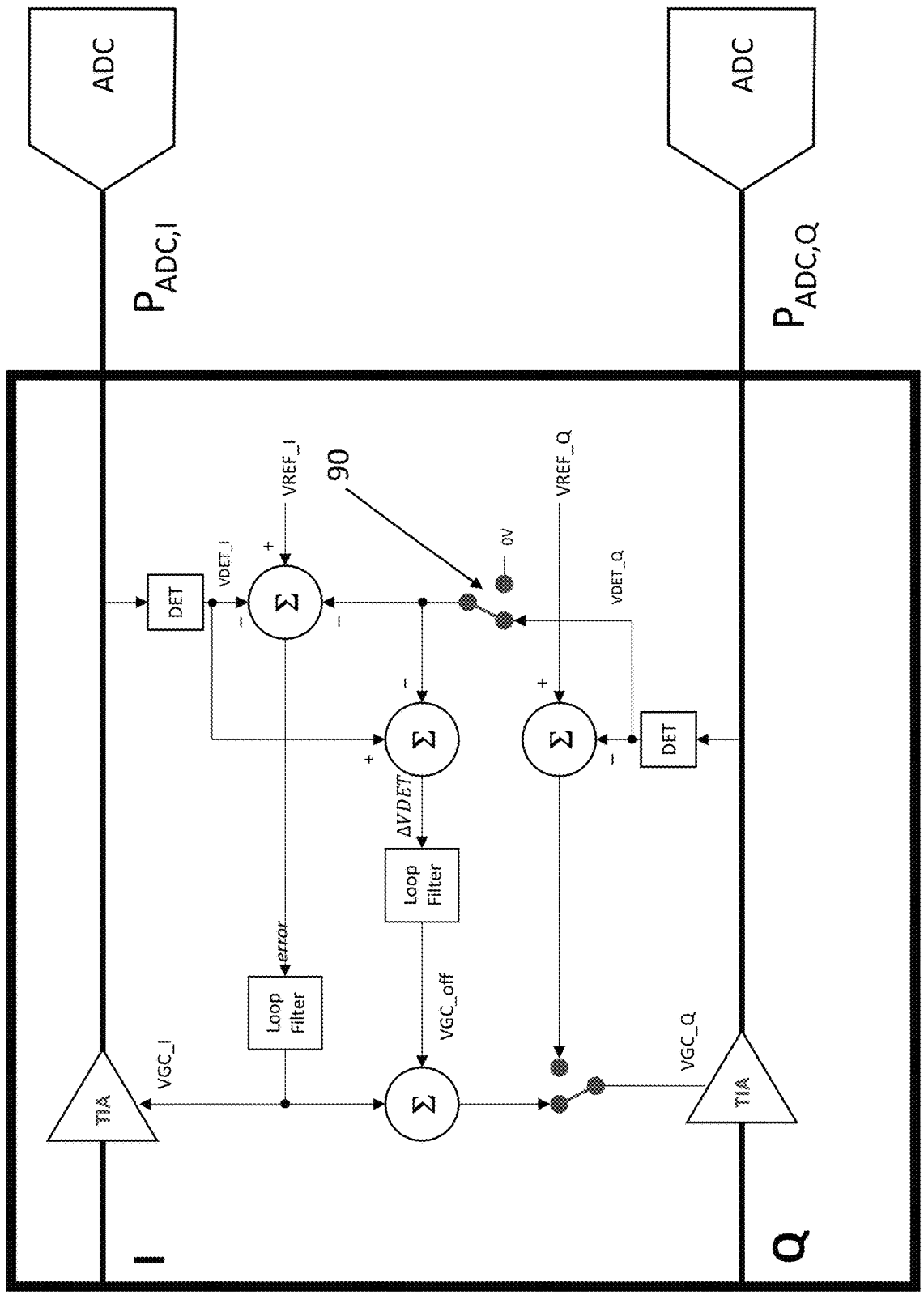
FIG. 12 is a schematic diagram illustrating a still further exemplary embodiment of the analog AGC loop implementation of the present disclosure, incorporating a common AGC loop and a hardware-based IQ gain balancing loop, operable in both "normal" and "common" modes.

FIG. 12 is a schematic diagram illustrating a still further exemplary embodiment of the analog AGC loop implementation of the present disclosure, incorporating a common AGC loop and a hardware-based IQ gain balancing loop, operable in both "normal" and "common" modes.

Figure 13:
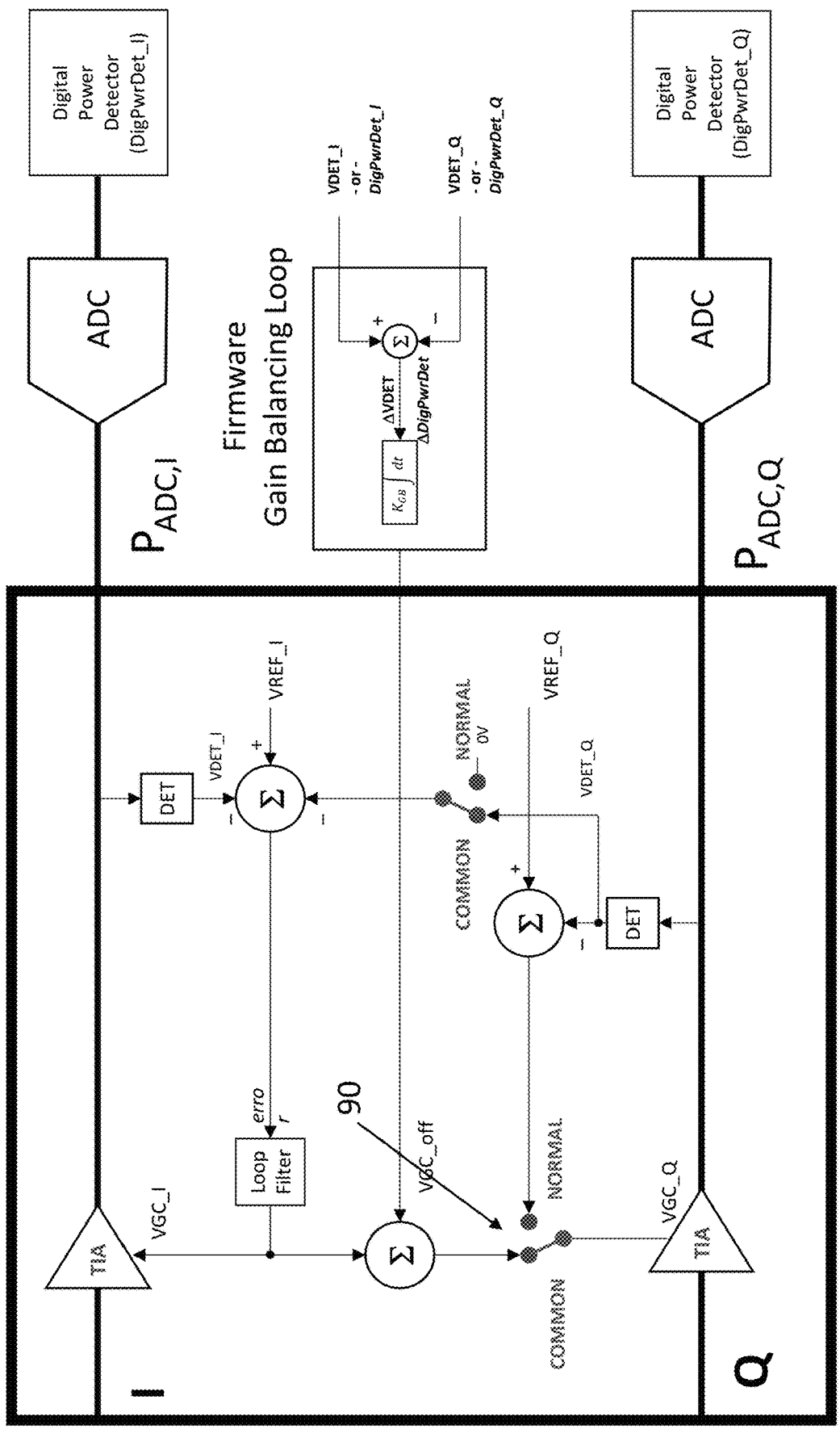
FIG. 13 is a schematic diagram illustrating a still further exemplary embodiment of the analog AGC loop implementation of the present disclosure, incorporating a common AGC loop and a firmware-based IQ gain balancing loop incorporating a post-ADC digital power detector instead of the analog power detector of the TIA, operable in both "normal" and "common" modes.

FIG. 13 is a schematic diagram illustrating a still further exemplary embodiment of the analog AGC loop implementation of the present disclosure, incorporating a common AGC loop and a firmware-based IQ gain balancing loop incorporating a post-ADC digital power detector instead of the analog power detector of the TIA, operable in both "normal" and "common" modes.

Thus, the present disclosure provides a multi-channel (dual or quad) TIA that has an integrated AGC function to provide a constant total I and Q power to the ADC ($P_{(ADC,Total)}=P_{(ADC,I)}+P_{(ADC,Q)}$) per polarization for a single-axis modulated signal, e.g., BPSK, 4ASK, or for an otherwise asymmetrically modulated signal. The integrated AGC includes a function to balance the receiver's I and Q gain to preserve the signal's asymmetrical I-Q power ratio. The IQ gain balancing function can be implemented in hardware or in firmware.

The multi-channel (dual or quad) TIA has the capability to switch between a dedicated AGC per tributary or a common AGC per pair of tributaries. This is a likely solution when the IQ gain balancing loop is a very slow loop, as it is more suitable to be implemented in firmware without adding more risk and complexity to the TIA design.

When the TIA chip is set to "NORMAL" mode, i.e., one dedicated AGC per tributary, each TIA gain will be controlled by its associated AGC to output a constant RF power to the ADC. Each tributary output power is set by its reference voltage, VREF_I and VREF_Q. When the TIA chip is set to "COMMON" mode, i.e., one common AGC per pair of tributaries (I and Q), the gain of the pair of TIAs will be controlled by a common AGC to output a constant total I and Q power to the ADC ($P_{(ADC,Total)}=P_{(ADC,I)}+P_{(ADC,Q)}$). The I-axis AGC is used as the common AGC, for example. The total I and Q output power is set by VREF_I. The I-axis TIA is controlled directly by the output of the AGC loop. To balance the I and Q gain, a facility is provided to add a DC offset voltage ($VGC_{off}$) to the Q-axis TIA gain. The algorithm of IQ gain balancing can again be implemented either in hardware (slide-7) or in firmware (slide-8,9) as shown.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can include random-access memory (RAM), read-only memory (ROM), electrically-erasable-programmable read-only memory (EEPROM), compact disc read-only memory (CD-ROM) or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), and Blu-ray disc, where disks usually reproduce data magnetically, while discs reproduce data optically with lasers. Combinations of the above should also be included within the scope of computer-readable media.

Instructions may be executed by one or more processors, such as one or more DSPs, general purpose microprocessors, ASICSs, FPGAs, complex programmable logic devices (CPLDs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A receiver for a coherent modem comprising:
   an in-phase (I) tributary coupled to a first analog-to-digital converter (ADC);
   a quadrature (Q) tributary coupled to a second ADC; and
   an automatic gain control circuit coupled to both outputs of the I tributary and the Q tributary, wherein the automatic gain control circuit determines an error from a combination of the outputs and provides a single output configured to set power for both the I tributary and the Q tributary,
   wherein the I tributary, the Q tributary, and the automatic gain control circuit are for a first polarization, and further comprising
   a second I tributary coupled to a third ADC;
   a second Q tributary coupled to a fourth ADC; and
   a second automatic gain control circuit coupled to both the second I tributary and the second Q tributary and configured to set power for both the second I tributary and the second Q tributary, wherein the second I tributary and the second Q tributary are for a second polarization.

2. The receiver of claim 1, wherein the receiver receives an asymmetrical or unbalanced constellation.

3. The receiver of claim 1, wherein the receiver receives a symmetrical constellation.

4. The receiver of claim 1, wherein the automatic gain control circuit is configured to track optical power transients on either the I tributary and the Q tributary.

5. The receiver of claim 1, further comprising a pair of transimpedance amplifiers with one transimpedance amplifier for each of the I tributary and the Q tributary.

6. The receiver of claim 1, wherein the automatic gain control circuit is configured to provide a constant total power for both of the I tributary and the Q tributary.

7. The receiver of claim 1, further comprising a gain balancing circuitry configured to set the power for both the I tributary and the Q tributary via a control signal.

8. The receiver of claim 1, wherein the receiver is in a pluggable coherent modem.

9. A method implemented in a receiver of a coherent modem comprising:
    operating an in-phase (I) tributary coupled to a first analog-to-digital converter (ADC);
    operating a quadrature (Q) tributary coupled to a second ADC; and
    performing an automatic gain control for both outputs of the I tributary and the Q tributary, wherein the automatic gain control circuit determines an error from a combination of the outputs and provides a single output configured to set power for both the I tributary and the Q tributary as a constant power,
    wherein the I tributary, the Q tributary, and the automatic gain control circuit are for a first polarization, and further comprising
        operating a second I tributary coupled to a third ADC;
        operating a second Q tributary coupled to a fourth ADC; and
        performing a second automatic gain control circuit coupled to both the second I tributary and the second Q tributary and configured to set power for both the second I tributary and the second Q tributary,
    wherein the second I tributary and the second Q tributary are for a second polarization.

10. The method of claim 9, wherein the receiver receives an asymmetrical or unbalanced constellation.

11. The method of claim 9, wherein the receiver receives a symmetrical constellation.

12. The method of claim 9, wherein the automatic gain control circuit is configured to track optical power transients on either the I tributary and the Q tributary.

13. The method of claim 9, further comprising operating a pair of transimpedance amplifiers with one transimpedance amplifier for each of the I tributary and the Q tributary.

14. The method of claim 9, further comprising operating a gain balancing circuitry configured to set the power for both the I tributary and the Q tributary via a control signal.

15. The method of claim 9, wherein the receiver is in a pluggable coherent modem.

16. A receiver for a coherent modem comprising:
    a first pair of analog-to-digital converters (ADCs) each connected to an X-polarization, in-phase (XI) tributary and an X-polarization, quadrature (XQ) tributary;
    a first automatic gain control circuit coupled to both the XI tributary and the XQ tributary configured to set power for both;
    a second pair of ADCs each connected to a Y-polarization, in-phase (YI) tributary and a Y-polarization, quadrature (YQ) tributary; and
    a second automatic gain control circuit coupled to both the YI tributary and the YQ tributary configured to set power for both,
    wherein each of the first automatic gain control circuit and the second automatic gain control circuit determine an error from a combination of outputs of each tributary and provide a single output to set the power for both.

17. The receiver of claim 16, wherein the receiver receives an asymmetrical or unbalanced constellation.

18. The receiver of claim 16, wherein the receiver receives a symmetrical constellation.

19. The receiver of claim 16, wherein the receiver is in a pluggable coherent modem.

* * * * *